US012707765B2

(12) United States Patent
Liu et al.

(10) Patent No.: US 12,707,765 B2
(45) Date of Patent: Aug. 11, 2026

(54) LIGHT EMITTING DIODE DEVICE

(71) Applicant: XIAMEN SAN'AN OPTOELECTRONICS CO., LTD., Xiamen (CN)

(72) Inventors: Shiwei Liu, Xiamen (CN); Dazhong Chen, Xiamen (CN); Jin Xu, Xiamen (CN); Baojun Shi, Nanan City (CN); Shuijie Wang, Xiamen (CN); Ke Liu, Xiamen (CN); Qiang Wang, Xiamen (CN); Yu-Tsai Teng, Xiamen (CN); Wen-Chia Huang, Xiamen (CN); Chung-Ying Chang, Xiamen (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 917 days.

(21) Appl. No.: 17/811,675

(22) Filed: Jul. 11, 2022

(65) Prior Publication Data

US 2023/0007967 A1 Jan. 12, 2023

(30) Foreign Application Priority Data

Jul. 12, 2021 (CN) ........................ 202110782179.0
Oct. 18, 2021 (CN) ........................ 202111212826.0

(51) Int. Cl.
*H10H 20/831* (2025.01)
*H10H 20/857* (2025.01)

(52) U.S. Cl.
CPC ...... *H10H 20/8312* (2025.01); *H10H 20/857* (2025.01)

(58) Field of Classification Search
CPC ......... H10H 29/14–142; H10H 29/011; H10H 29/8321
See application file for complete search history.

(56) References Cited

U.S. PATENT DOCUMENTS 5,073,806 A * 12/1991 Idei ........................ H10H 29/14 372/50.1
D681,569 S * 5/2013 Yeh .............................. D13/180
D728,494 S * 5/2015 Yeh .............................. D13/180
(Continued)

FOREIGN PATENT DOCUMENTS

CN 104241508 A * 12/2014 ........... H10H 20/857
CN 105531834 A * 4/2016 ........... H01L 25/167
(Continued)

*Primary Examiner* — Joshua King
(74) *Attorney, Agent, or Firm* — MUNCY, GEISSLER, OLDS & LOWE, P.C.

(57) ABSTRACT

A light emitting diode device includes a substrate having a substrate surface, an epitaxial structure having an epitaxial surface opposite to the substrate surface, and a plurality of bridging electrodes disposed on the epitaxial surface. The epitaxial structure includes first, second and third light emitting units spacedly and sequentially disposed on the substrate surface. A projection of the second light emitting unit has a first edge and a second edge that is connected with and perpendicular to the first edge. The epitaxial surface has an operating zone on the second light emitting unit that is adapted to be pushed by an ejector pin. A length of the second edge is equal to or greater than a diameter of the operating zone.

12 Claims, 11 Drawing Sheets

(56) References Cited

U.S. PATENT DOCUMENTS 9,171,883 B2 * 10/2015 Chen .................... H10H 20/857
D748,592 S * 2/2016 Yeh .............................. D13/180
10,050,081 B2 * 8/2018 Huang ................... H10H 29/10
2005/0253151 A1 * 11/2005 Sakai ................... H10H 20/813 257/164
2006/0022207 A1 * 2/2006 Nishida ................ H10H 29/142 438/22
2011/0089442 A1 * 4/2011 Jing ................... H10H 20/8316 257/E33.065
2012/0049214 A1 * 3/2012 Lowes ................ H01L 25/0753 257/E33.056
2012/0187431 A1 * 7/2012 Bergmann ........... H10H 20/832 438/26
2013/0234170 A1 * 9/2013 Lim ....................... H10H 29/14 257/88
2013/0234172 A1 * 9/2013 Yeh ...................... H10H 20/857 257/88
2014/0131657 A1 * 5/2014 Kim ..................... H10H 20/831 257/13
2014/0145218 A1 * 5/2014 Kim ..................... H10H 20/833 438/29
2014/0175465 A1 * 6/2014 Lee ...................... H10H 20/841 257/88
2014/0353692 A1 * 12/2014 Oh ....................... H10H 20/813 257/88
2015/0034996 A1 * 2/2015 Chao .................... H10H 20/857 257/99
2015/0243706 A1 * 8/2015 Oh ......................... H10H 29/10 438/34
2015/0359056 A1 * 12/2015 Song .................... H10H 20/812 315/186
2016/0161098 A1 * 6/2016 Tudorica ................ H05B 45/56 362/249.14
2016/0343910 A1 * 11/2016 Huang ................... H10H 29/10
2017/0263674 A1 * 9/2017 Yang ...................... H10H 20/84
2018/0190864 A1 * 7/2018 Kim ..................... H10H 20/857
2019/0051805 A1 * 2/2019 Oh ....................... H10H 20/814
2019/0229235 A1 * 7/2019 Iguchi .................. H10H 20/825
2020/0176530 A1 * 6/2020 Baek ...................... H10K 85/00

FOREIGN PATENT DOCUMENTS

CN 107768396 A * 3/2018 ....... H01L 21/76838
CN 110085576 A * 8/2019 ......... H01L 25/0753
CN 111146234 A * 5/2020 ........... H10H 20/857
CN 112531084 A * 3/2021 ........... H10H 20/857
CN 113363364 A * 9/2021 ........... H10H 20/857
DE 19911717 A1 * 9/2000 ........... H10H 20/819
JP 2006066845 A * 3/2006 ............. H10H 29/10
JP 2009519604 A * 5/2009 ............. H10H 29/14
KR 20120031207 A * 3/2012 ........... H10H 20/833

* cited by examiner

LIGHT EMITTING DIODE DEVICE

CROSS-REFERENCE TO RELATED APPLICATION

This application claims priority of Chinese Invention Patent Application Nos. 202110782179.0 (filed on Jul. 12, 2021) and 202111212826.0 (filed on Oct. 18, 2021). The entire content of each of the Chinese patent applications is incorporated herein by reference.

FIELD

The disclosure relates to a semiconductor device, and more particularly to a light emitting diode device.

BACKGROUND

Flip-chip light emitting diodes (LEDs) with reduced size have been widely applied in various display products such as backlit displays and RGB displays. At present, a display product may include thousands or even tens of thousands of LEDs, each of which may include a single light emitting unit or two light emitting units connected in series and flipped over and mounted on a circuit board. When the size of the LEDs becomes smaller, the distance between dies becomes closer, thereby increasing the contrast ratio of the display products.

In manufacturing the display products, the LEDs need to be transferred from a growth substrate to the circuit board through pushing a central area (operating zone) of a front side of the LEDs by an ejector pin. However, such a manufacturing process has disadvantages such as high technical requirement, high cost, low transferring efficiency and low alignment precision. In an example where each LED includes two light emitting units spaced-apart by a groove, the operating zone for the ejector pin is commonly located at the groove and side regions of the LED light emitting units adjacent to the groove. An insulating layer on each LED is susceptible to cracking during the operation of the ejector pin since the groove is not completely flat. Cracks in the insulating layer may result in current leakage in the LED.

An approach to solve the cracking problem is to dispose metal blocks in the groove to prevent the insulating layers of the LEDs from being damage by the ejector pin. However, these metal blocks may absorb the light emitted by the light emitting units of the LEDs, which may influence the light emitting efficiency of the LEDs.

SUMMARY

Therefore, an object of the disclosure is to provide a light emitting diode (LED) device that can alleviate at least one of the drawbacks of the prior art.

According to the disclosure, the LED device includes a substrate having a substrate surface, an epitaxial structure having an epitaxial surface opposite to the substrate surface, and a plurality of bridging electrodes.

The substrate surface includes a first side and a second side that is connected with and perpendicular to the first side. The first side has a length equal to or greater than a length of the second side.

The epitaxial structure includes a first light emitting unit, a second light emitting unit and a third light emitting unit that are spacedly and sequentially disposed on the substrate surface in such order along a direction away from the second side. Each of the first light emitting unit, the second light emitting unit and the third light emitting unit includes a first semiconductor layer, an active layer and a second semiconductor layer sequentially formed on the substrate surface in a direction away from the substrate surface. A projection of each of the first light emitting unit, the second light emitting unit and the third light emitting unit on the substrate surface has a first edge and a second edge that is connected with and perpendicular to the first edge. The first edge is parallel to the second side of the substrate and has a length equal to or greater than a length of the second edge.

Each of the bridging electrodes is disposed on the epitaxial surface and is electrically connected between two adjacent ones of the first light emitting unit, the second light emitting unit and the third light emitting unit.

The second light emitting unit further has a flat operating zone on the epitaxial surface that is adapted to be pushed by an ejector pin and that is in a circular form. The length of the second edge is equal to or greater than a diameter of the operating zone. The diameter of the operating zone is at least 60 μm.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
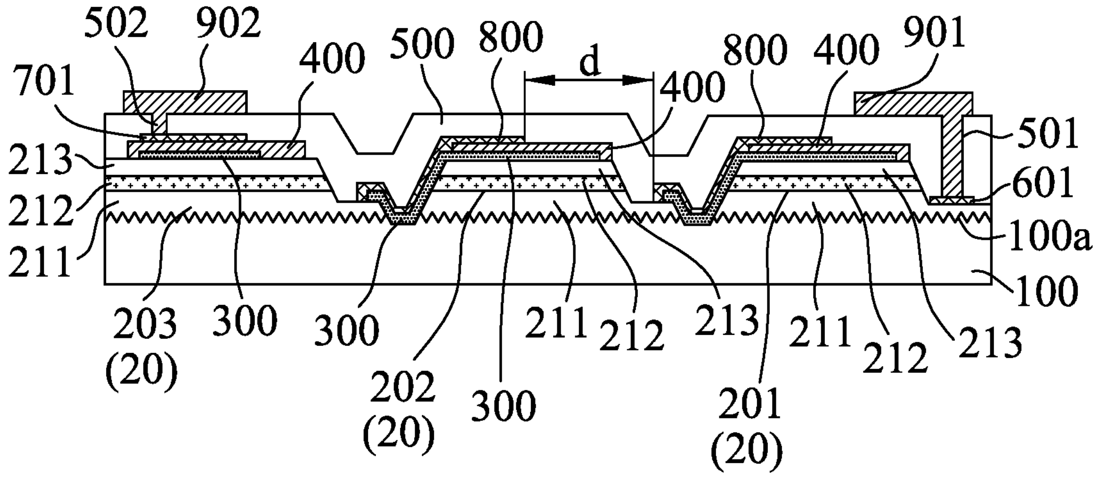
FIG. 1 is a cross-sectional schematic view illustrating a first embodiment of a light emitting diode (LED) device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
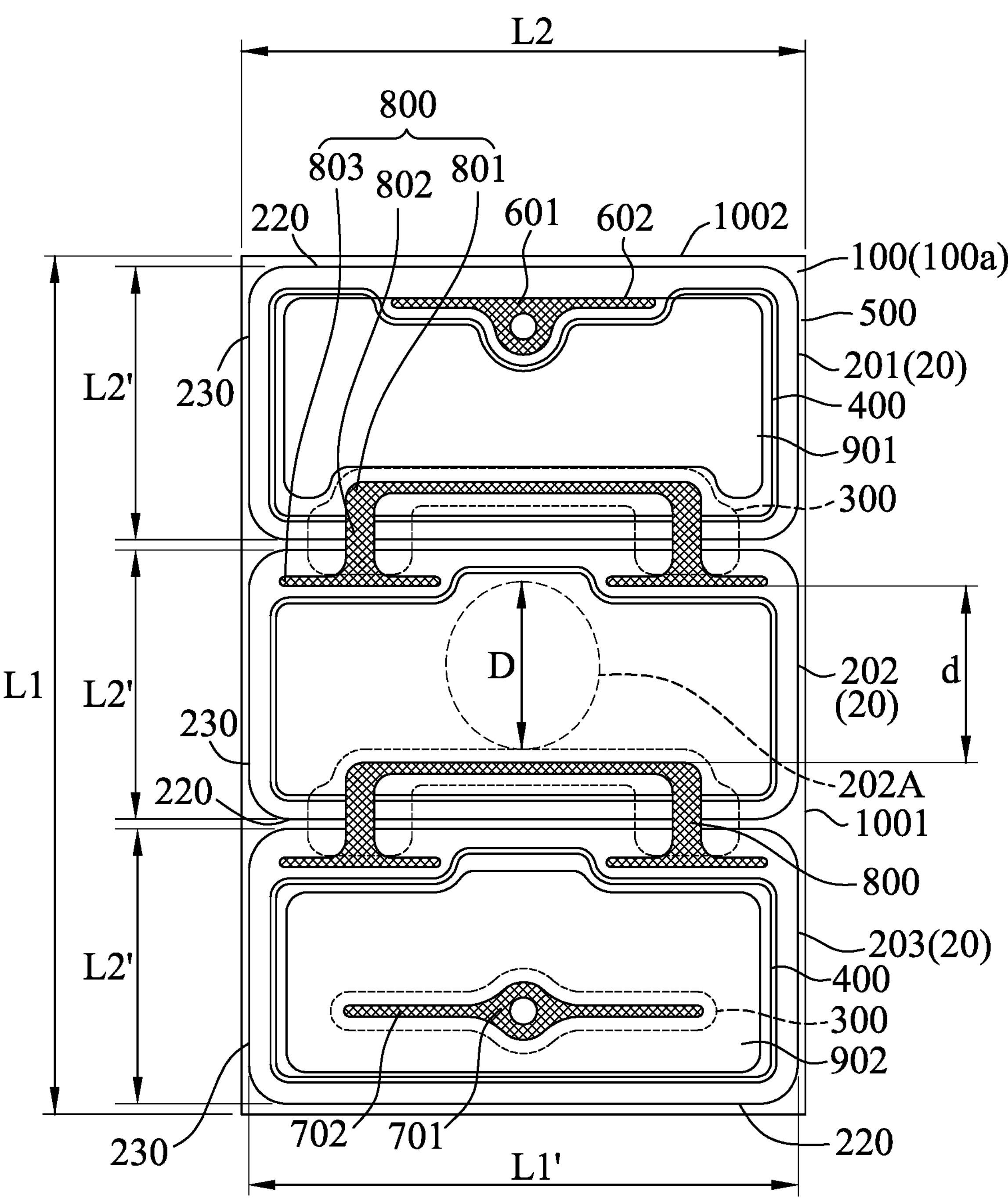
FIG. 2 is a schematic top view illustrating the first embodiment of the LED device.

Referring to FIGS. 1 and 2, a first embodiment of a light emitting diode (LED) device according to the disclosure includes a substrate 100, an epitaxial structure 20, a current blocking layer 300, a transparent and electrically conductive layer 400, a first electrode 601, a second electrode 701, an insulating layer 500, a plurality of bridging electrodes 800, a first solder pad 901 and a second solder pad 902.

Examples of the substrate 100 may include, but are not limited to, a sapphire substrate. In this embodiment, the substrate 100 is a sapphire substrate. The substrate 100 has a substrate surface 100*a* including a first side 1001 and a second side 1002 that is connected with and perpendicular to the first side 1001. The first side 1001 has a length (L1) equal to or greater than a length (L2) of the second side 1002. The lengths (L1, L2) of the first side 1001 and the second side 1002 may be independently equal to or smaller than 500 μm. For example, in this embodiment, the length (L1) of the first side 1001 is 450 μm, and the length (L2) of the second side 1002 is 300 μm. In some embodiments, a ratio of the length (L1) of the first side 1001 to the length (L2) of the second side 1002 of the substrate 100 is not greater than 3:1. In an example of the substrate surface 100*a* having a rectangular shape, the ratio of the length (L1) to the length (L2) is 2:1. It should be noted that when a ratio of the first side 1001 to the second side 1002 is too large (i.e., the substrate 100 has relatively long and narrow dimensions), strain would be generated by the epitaxial structure 20 on the substrate 100 which may cause cracks to form in the LED device. Defects such as cracks reduce manufacturing yield and affects the light-emitting uniformity of the LED device.

The epitaxial structure 20 has an epitaxial surface opposite to the substrate surface 100*a* and includes three light emitting units, i.e., a first light emitting unit 201, a second light emitting unit 202 and a third light emitting unit 203 that are spacedly and sequentially disposed on the substrate surface 100*a* in such order along a direction away from the second side 1002 of the substrate 100. In this embodiment, the first, second and third light emitting units 201, 202, 203 are aligned along the direction away from the second side 1002 of the substrate 100, and are spaced apart from one another by grooves that expose portions of the substrate surface 100*a*. In other words, bottom portions of the grooves are the substrate surface 100*a*. Each of the grooves between two adjacent ones of the first to third light emitting units 201, 202, 203 has a width equal to or smaller than 30 μm. In some embodiments, the epitaxial structure 20 is formed on a central portion of the substrate surface 100*a* of the substrate 100 and a peripheral portion of the substrate surface 100*a* surrounding the central portion is exposed.

Each of the first, second and third light emitting units 201, 202, 203 includes a first semiconductor layer 211, an active layer 212 and a second semiconductor layer 213 that are sequentially formed on the substrate surface 100*a* in a direction away from the substrate surface 100*a*. For each of the first, second and third light emitting units 201, 202, 203, a stepped structure may be formed by an etching process to expose a portion of the first semiconductor layer 211. The first semiconductor layer 211 and the second semiconductor layer 213 have different (i.e., opposite) conductivity types, electrical properties, polarities or doping elements that are configured to provide electrons or holes. For example, when the first semiconductor layer 211 is an n type semiconductor layer, the second semiconductor layer 213 should be a p type semiconductor layer, and vice versa. Combinations of electrons and holes provided by the first and second semiconductor layers 211, 213 in the active layer 212 is triggered by current and the electricity is transformed into photon energy to emit light. In this embodiment, each of the first, second and third light emitting units 201, 202, 203 emits blue light.

A projection of each of the first light emitting unit 201, the second light emitting unit 202 and the third light emitting unit 203 on the substrate surface 100*a* has a first edge 220 and a second edge 230 that is connected with and perpendicular to the first edge 220. The first edge 220 has a length (L1') that is equal to or greater than a length (L2') of the second edge 230. In some embodiments, the length (L1') of the first edge 220 is smaller than the length (L2) of the second side 1002. In certain embodiments, for each of the first, second and third light emitting units 201, 202, 203, the first edge 220 may be parallel to the second side 1002 of the substrate 100. In some embodiments, for each of the first, second and third light emitting units 201, 202, 203, a ratio of the length (L1') of the first edge 220 to the length (L2') of the second edge 230 is not greater than 3:1, which may avoid problems associated with current spreading. The projection of each of the first, second and third light emitting units 201, 202, 203 may be equal to or smaller than about 65000 $\mu m^2$, such as ranging from about 30000 $\mu m^2$ to about 65000 $\mu m^2$. The substrate 100 may have a reduced thickness, such as ranging from about 40 μm to about 150 μm, so as to obtain a miniaturized thin-type LED device.

The current blocking layer 300 is disposed on the epitaxial surface of the epitaxial structure 20 and the exposed substrate surface 100*a* between any two adjacent ones of the first, second and third light emitting units 201, 202, 203. Examples of an insulating material for making the current blocking layer 300 may include, but are not limited to, silicon oxide, silicon nitride, silicon oxynitride, aluminum oxide and combinations thereof.

The transparent and electrically conductive layer 400 is formed on the epitaxial surface of the epitaxial structure 20. To be specific, the transparent and electrically conductive layer 400 covers a portion of the current blocking layer 300 that is disposed on the first, second and third light emitting units 201, 202, 203, and a portion of the current blocking layer 300 that is disposed between the two adjacent ones of the first, second and third light emitting units 201, 202, 203 is exposed therefrom. A projection of the transparent and electrically conductive layer 400 on the substrate surface 100*a* may fall within the projection of a corresponding one of the first, second and third light emitting units 201, 202, 203. The transparent and electrically conductive layer 400 may be made of a metallic material or a transparent conductive material, which allows light emitted from the active layer 212 to pass therethrough, such as indium tin oxide, zinc oxide, aluminum zinc oxide, gallium zinc oxide, indium zinc oxide, etc.

Each of the bridging electrodes 800 is disposed on the epitaxial surface and electrically connected between two adjacent ones of the first, second and third light emitting units 201, 202, 203. Each of the bridging electrodes 800 is a metal electrode that has a width ranging from 2 μm to 10 μm. Each of the bridging electrodes 800 covers the exposed portions of the current blocking layer 300 that is not covered by the transparent and electrically conductive layer 400. The bridging electrodes 800 electrically connect the first, second and third light emitting units 201, 202, 203 in series. In this embodiment, two bridging electrodes 800 are used for connection of the first, second and third light emitting units 201, 202, 203. One of the bridging electrodes 800 is electrically connected between the second semiconductor layer 213 of the first light emitting unit 201 and the first semiconductor layer 211 of the second light emitting unit 202. The other one of the bridging electrodes 800 is electrically connected between the second semiconductor layer 213 of the second light emitting unit 202 and the first semiconductor layer 211 of the third light emitting unit 203.

The first electrode 601 is disposed on and electrically connected to the exposed portions of the first semiconductor layer 211 of the first light emitting unit 201. The second electrode 701 is disposed on and electrically connected to the second semiconductor layer 213 of the third light emitting unit 203. To be specific, the second electrode 701 is in contact with and is electrically connected to a portion of the transparent and electrically conductive layer 400 that is disposed on the second semiconductor layer 213 of the third light emitting unit 203. Each of the first electrode 601 and the second electrode 701 includes an extension portion 602, 702 which extends along the first edge 220 (as shown in FIG. 2). Each of the extension portions 602, 702 may be made of metal so that current passing therethrough may be uniformly spread. For each of the first electrode 601 and the second electrode 701, the extension portion 602, 702 may be disposed in parallel to the first edge 220.

The insulating layer 500 covers the epitaxial structure 20, the bridging electrodes 800, the first electrode 601 and the second electrode 602. In other words, the insulating layer 500 may cover the epitaxial surface and side faces of the epitaxial structure 20 connecting the epitaxial surface, and may be extended to be disposed on the exposed substrate surface 100*a* between the first, second and third light emitting units 201, 202, 203. In this way, the insulating layer 500 is capable of covering the side faces of the epitaxial structure 20 in a more stable manner.

The insulating layer 500 is a light-reflecting insulating layer, and is configured to reflect light emitted from the first, second and third light emitting units 201, 202, 203 toward the substrate 100, so that the reflected light can emit from a light-exiting surface of the substrate 100 opposite to the substrate surface 100*a* and a side surface of the substrate 100 interconnecting the substrate surface 100*a* and the light-exiting surface. The insulating layer 500 may include a distributed Bragg reflector (DBR), which may be formed by alternately stacking dielectric layers having different refractive indices. Each of the dielectric layers may be made of $TiO_2$, $SiO_2$, $HfO_2$, $ZrO_2$, $Nb_2O_5$ or $MgF_2$.

The insulating layer 500 is formed with a first through hole 501 exposing the first electrode 601 and a second through hole 502 exposing the second electrode 602. The first solder pad 901 is disposed on the first light emitting unit 201 and fills the first through hole 501 to be electrically connected to the first electrode 601. The second solder pad 902 is disposed on the third light emitting unit 203 and fills the second through hole 502 to be electrically connected to the second electrode 701.

The second light emitting unit 202 further has a flat operating zone 202A on the epitaxial surface of the epitaxial structure 20 that is adapted to be pushed by an ejector pin and that is in a circular form. The operating zone 202A has a diameter (D) which is at least 60 μm. In some embodiments, the diameter (D) of the operating zone 202A ranges from 60 μm to 80 μm. The length (L2') of the second edge 230 may be equal to or greater than the diameter (D) of the operating zone 202A. In some embodiments, the length (L2') of the second edge 230 is at least 80 μm. In this way, the bridging electrodes 800 may be disposed at two opposite sides of the operating zone 202A so as to prevent a portion of the insulating layer 500 located on the bridging electrodes 800 from being damaged by the ejector pin, which may cause current leakage in the LED device.

In certain embodiments, a projection of one of the bridging electrodes 800 electrically connected between the first light emitting unit 201 and the second light emitting unit 202 on the substrate surface 100*a* is spaced apart from a projection of another one of the bridging electrodes 800 electrically connected between the second light emitting unit 202 and the third light emitting unit 203 by a distance (d) along the second edge 230 that may be equal to or greater than 60 μm, such as ranging from 60 μm to 100 μm.

In order to further improve the transferability of the first, second and third light emitting units 201, 202, 203, a projection of the first electrode 601 on the substrate surface 100*a* is spaced apart from the projection of the one of the bridging electrodes 800 electrically connected between the first light emitting unit 201 and the second light emitting unit 202 by a distance along the second edge 230 that is at least 80 μm, and the length (L1') of the first edge 220 of the second light emitting unit 202 is at least 100 μm. In a case of the length (L1) of the first side 1001 being not greater than 500 μm, for each of the first, second and third light emitting units 201, 202, 203, the length (L2') of the second edge 230 is not greater than 150 μm.

Figure 3:
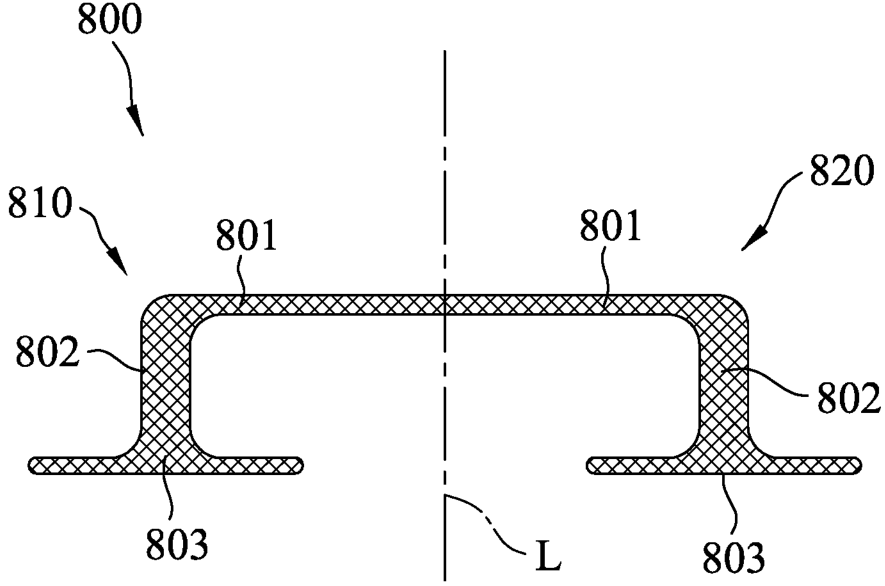
FIG. 3 is a schematic top view illustrating a bridging electrode of the first embodiment of the LED device.

Further referring to FIG. 3, each of the bridging electrodes 800 includes a first bridging sub-electrode 810 and a second bridging sub-electrode 820 which are symmetrically arranged on opposite sides of a central axis (L) that extends along the first side 1001 and is perpendicular to the first edge 220. Each of the first bridging sub-electrode 810 and the second bridging sub-electrode 820 is electrically connected between the two adjacent ones of the first, second and third light emitting units 201, 202, 203. Therefore, if one of the first bridging sub-electrode 810 and the second bridging sub-electrode 820 is damaged and cannot conduct electricity, the other one can still maintain conductivity to allow normal functioning of the LED device.

For each of the bridging electrodes 800, each of the first bridging sub-electrode 810 and the second bridging sub-electrode 820 includes a first portion 801, a second portion 803 and a connecting portion 802. The first portion 801 is disposed on the second semiconductor layer 213 of one of the two adjacent ones of the first, second and third light emitting units 201, 202, 203. The second portion 803 is disposed on the first semiconductor layer 211 of the other one of the two adjacent ones of the first, second and third light emitting units 201, 202, 203. The connecting portion 802 connects the first portion 801 to the second portion 803 and is disposed across the two adjacent ones of the first, second and third light emitting units 201, 202, 203.

In some embodiments, each of the first electrode 601 and the second electrode 701 is disposed at the center of the first edge 220. The extension portion 602 of the first electrode 601 and the extension portion 702 of the second electrode 701 are respectively arranged at peripheral regions of the first and third light emitting units 201 and 203. For each of the first bridging sub-electrodes 810 and the second bridging electrodes 820, the first portions 801 are disposed at the adjacent peripheral regions of the first and second light emitting units 201, 202, and the second portions 803 are disposed at the adjacent peripheral regions of the second and third light emitting units 202, 203. With such arrangement, the first electrode 601, the second electrode 701 and the bridging electrodes 800 are not located in a geometric center of the LED device such that the ejector pin would not push or even penetrate the regions of the insulating layer 500 that correspond in position to these electrodes so as to avoid damage that may cause current leakage.

In some embodiments, for each of the first and second bridging sub-electrodes 810 and 820, a projection of the third portions 803 of one of the bridging electrodes 800 electrically connected between the first light emitting unit 201 and the second light emitting unit 202 on the substrate surface 100*a* is spaced apart from a projection of the first portions 801 of another one of the bridging electrodes 800 electrically connected between the second light emitting unit 202 and the third light emitting unit 203 on the substrate surface 100*a* by the distance (d) along the second edge 230 that ranges from 60 μm to 100 μm.

In the first embodiment, for each of the bridging electrodes 800, the first portions 801 of the first bridging sub-electrode 810 and the second bridging sub-electrode 820 are connected to each other, while the second portions 803 of the first bridging sub-electrode 810 and the second bridging sub-electrode 820 are separated from each other. Therefore, the first bridging sub-electrode 810 and the second bridging sub-electrode 820 may be connected in a U shape. In some embodiments, the first bridging sub-electrode 810 and the second bridging sub-electrode 820 may form into an integral structure, which extends across the groove formed between two adjacent ones of the first, second and third light emitting units 201, 202, 203 and thus can facilitate current spreading. The connecting portion 802 has a width, which is measured in a first direction in parallel to the first edge 220, greater than that of the first portion 801 and that of the second portion 803, which are respectively measured in a second direction perpendicular to the first direction, thereby ensuring the reliability of the second bridging sub-electrodes 802. The width of the first portion 801, the connecting portion 802 and the second portion 803 may independently range from 2 μm to 10 μm.

In some embodiments, for each of the bridging electrodes 800, the first portions 801 of the first bridging sub-electrode 810 and the second bridging sub-electrode 820 are parallel to the first edge 220, and the second portions 803 of the first bridging sub-electrode 810 and the second bridging sub-electrode 820 are also parallel to the first edge 220. The extension portions 602, 702 of the first electrode 601 and the second electrode 701 are disposed in parallel to the first portion 801 and the third portion 803. Such arrangement may ensure that the current is uniformly distributed in the light emitting units with a rectangular shape.

The first solder pad 901 is disposed on the first light emitting unit 201 and is electrically connected to the first electrode 601. The second solder pad 902 is disposed on the third light emitting unit 203 and is electrically connected to the second electrode 701. A projection of the first solder pad 901 on the substrate surface 100*a* does not overlap with the projection of the bridging electrodes 800 on the substrate surface 100*a*, and a projection of the second solder pad 902 on the substrate surface 100*a* does not overlap with the projection of the bridging electrodes 800 on the substrate surface 100*a*, so that the reliability of the LED device may be further improved.

Figure 4:
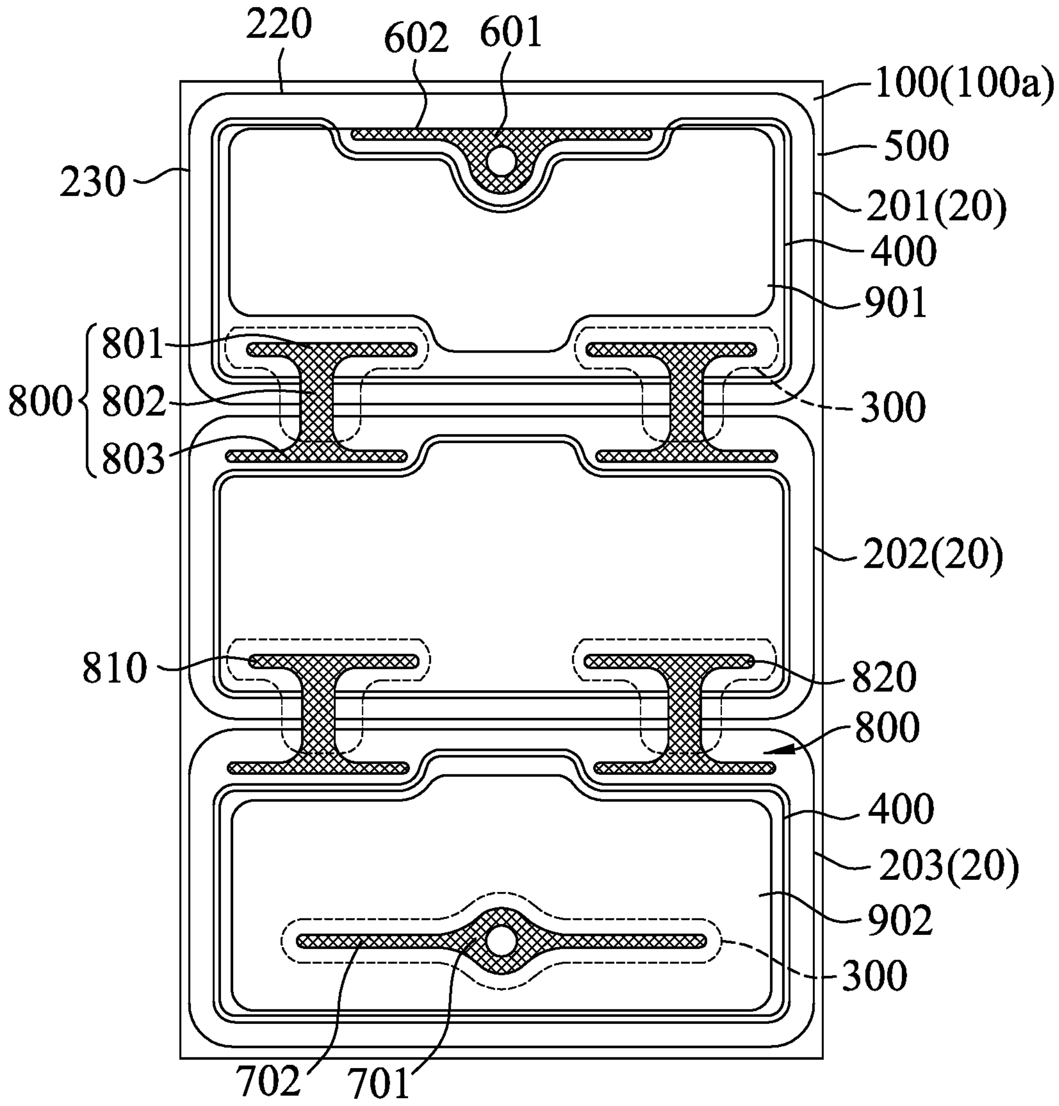
FIG. 4 is a schematic top view illustrating a second embodiment of the LED device.
Figure 5:
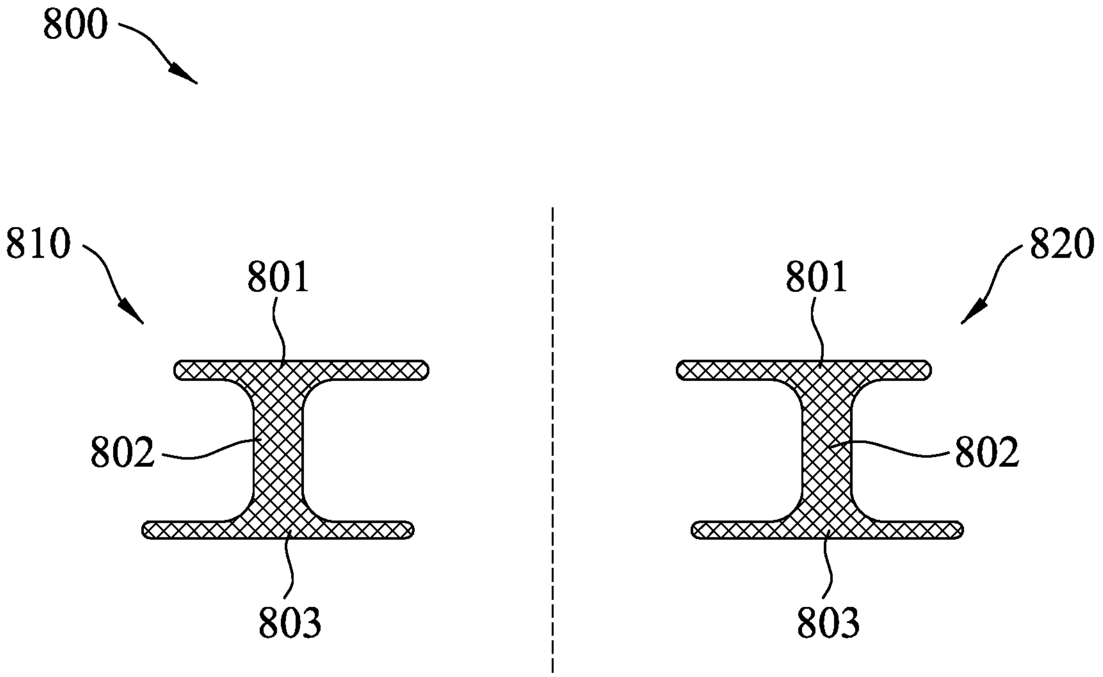
FIG. 5 is a schematic top view illustrating a bridging electrode of the second embodiment of the LED device.

Referring to FIGS. 4 and 5, a second embodiment of the LED device is generally similar to the first embodiment, except that in the second embodiment, the first portions 801 of the first bridging sub-electrode 810 and the second bridging sub-electrode 820 are separated from each other, and the second portions 803 of the first bridging sub-electrode 810 and the second bridging sub-electrode 820 are separated from each other.

That is, the first bridging sub-electrode 810 and the second bridging sub-electrode 820 of the second embodiment are independent bridging structures that are arranged along the first edge 220. The first portions 801 and the second portions 803 extending along the first edge 220 are capable of effectively spreading the current. Further, since the first portions 801 of the first bridging sub-electrode 810 and the second bridging sub-electrode 820 are separated from each other, the operating zone 202A on the second light emitting unit 202 may be larger such that when the ejector pin pushes the regions of the insulating layer 500 that correspond in position to bridging electrodes 800, the chances of penetration may be reduced and the reliability of the LED device may be further enhanced.

Figure 6:
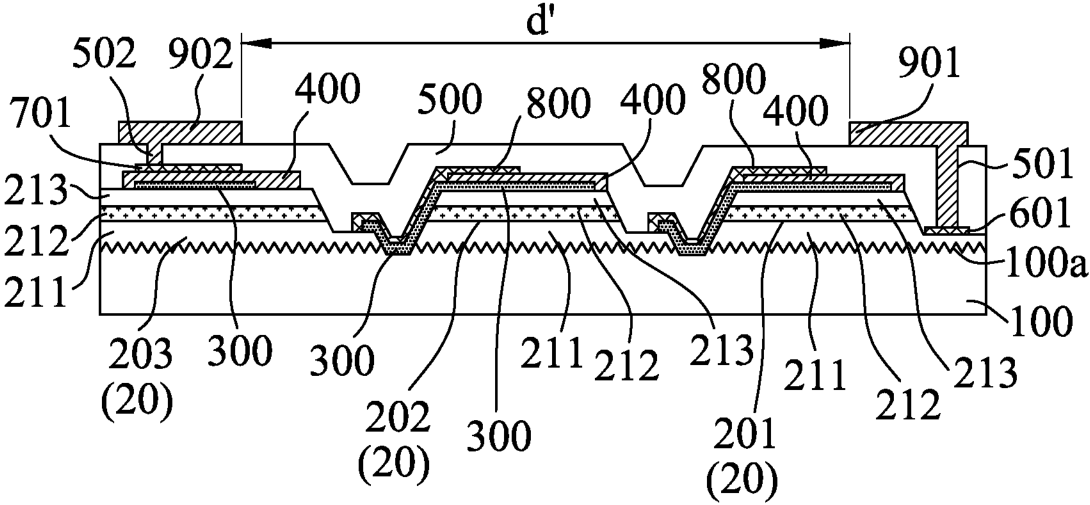
FIG. 6 is a cross-sectional schematic view illustrating a third embodiment of the LED device.
Figure 7:
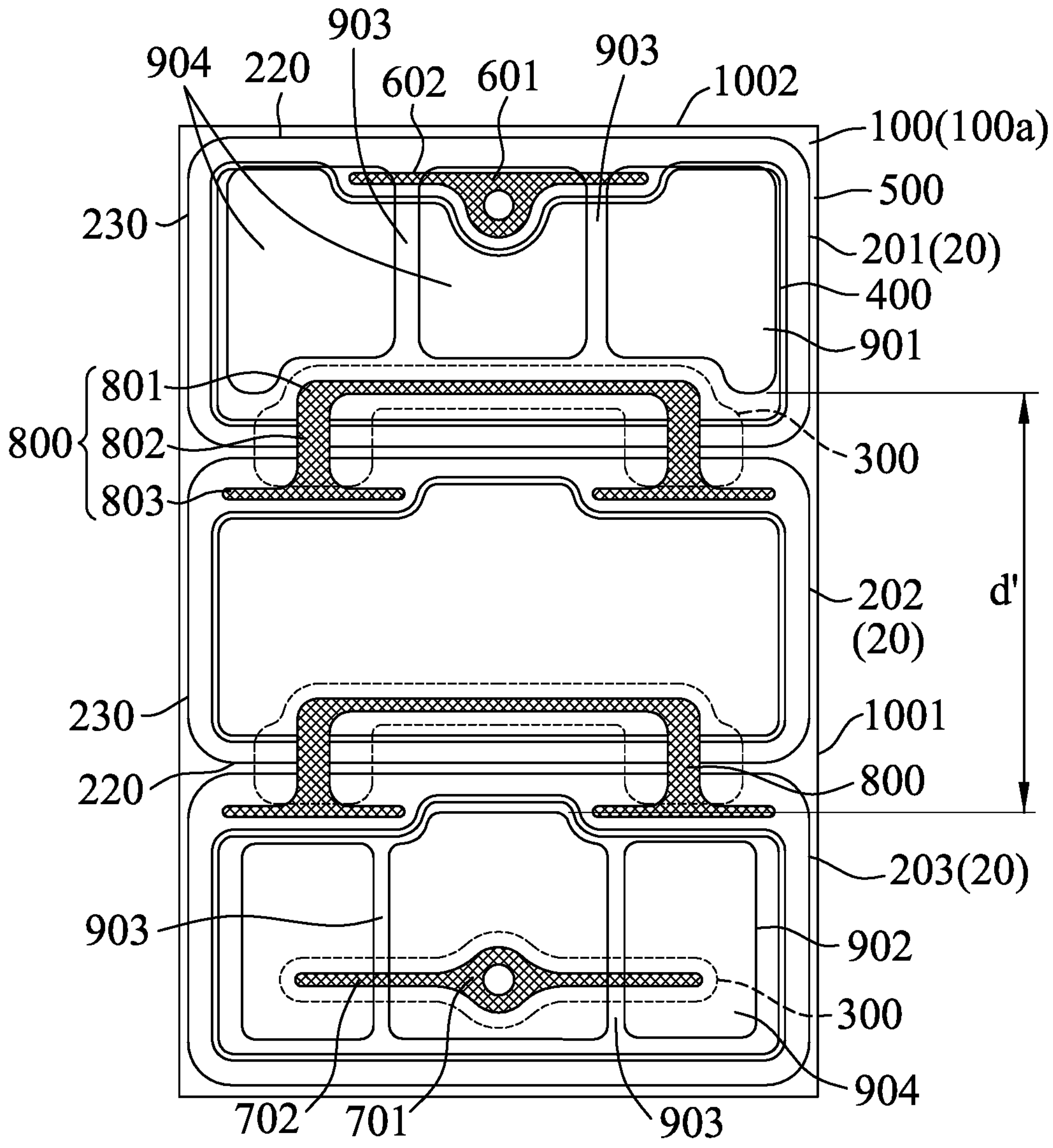
FIG. 7 is a schematic top view illustrating the third embodiment of the LED device.

Referring to FIGS. 6 and 7, a third embodiment of the LED device is generally similar to the first embodiment, except for the following difference. Specifically, in this embodiment, at least one of the first solder pad 901 and the second solder pad 902 includes a plurality of solder sub-pads 904 that are spaced apart from each other by at least one trench 903. For example, each of the first solder pad 901 and the second solder pad 902 includes the solder sub-pads 904 that are spaced apart from each other by a plurality of the trenches 903. By having this structure, strain, which is generated on the first solder pad 901 and the second solder pad 902 due to the difference in coefficients of thermal expansion (CTE) between the insulating layer 500 and the first and second solder pads 901, 902, may be released by the trenches 903 so that the first solder pad 901 and the second solder pad 902 would not be easily dislocated from the epitaxial structure 20, especially when the LED device is used in environments with high temperature fluctuation.

In addition, a projection of the at least one trench 903 on the substrate surface 100*a* does not overlap with a projection of the first through hole 501 of the insulating layer 500 on the substrate surface 100*a* and a projection of the second through hole 502 of the insulating layer 500 on the substrate surface 100*a*. At least one of the solder sub-pads 904 of the first solder pad 901 may fill the first through hole 501, and at least one of the solder sub-pads 904 of the second solder pad 902 may fill the second through hole 502. In some embodiments, each of the solder sub-pads 904 of the first solder pad 901 fills the first through hole 501, and each of the solder sub-pads 904 of the second solder pad 902 fills the second through hole 502.

The first solder pad 901 and the second solder pad 902 are spaced apart from each other by a distance (d') that is greater than a width of the at least one trench 903 (i.e., the distance between two adjacent ones of the solder sub-pads 904).

Figure 8:
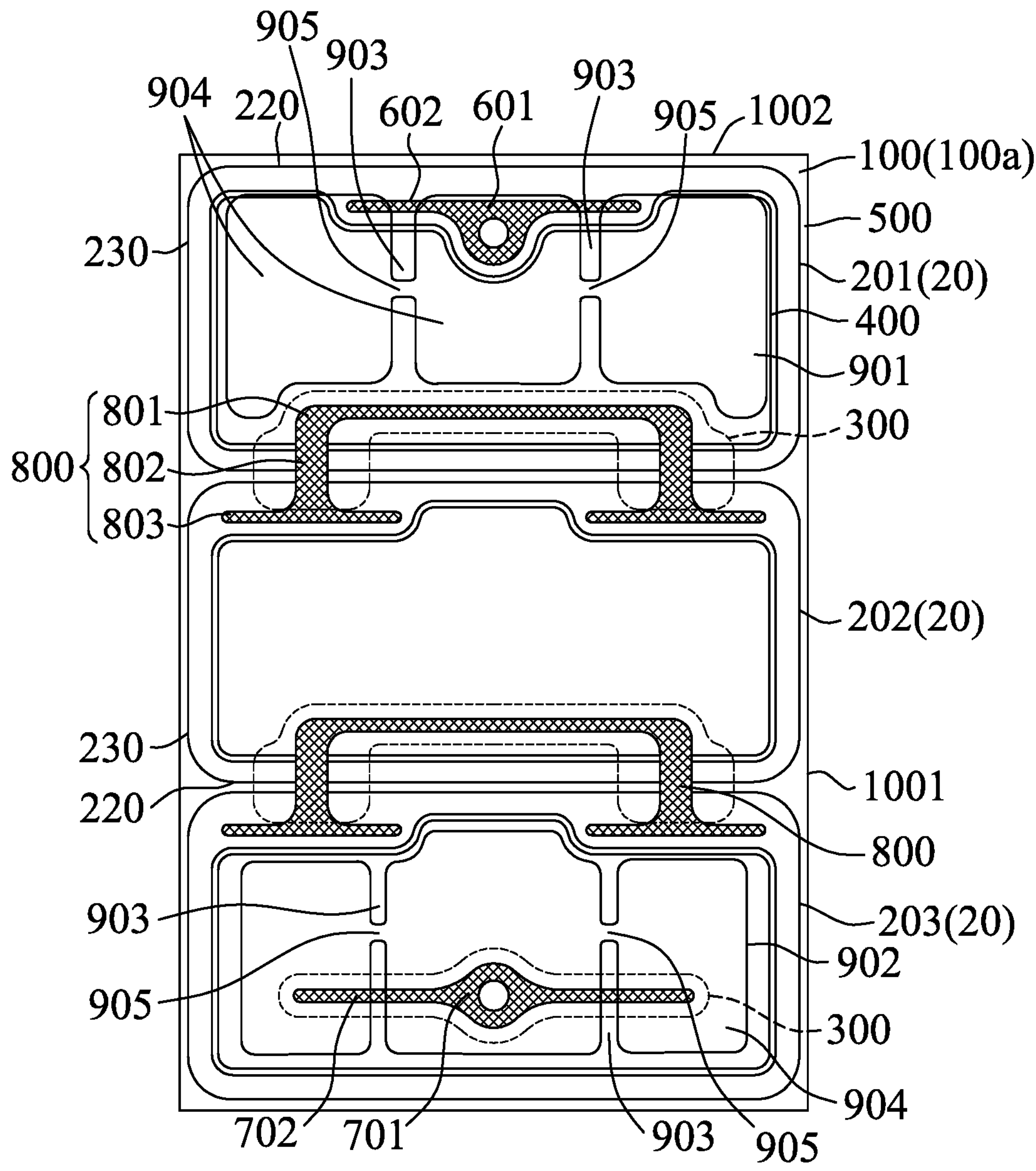
FIG. 8 is a schematic top view illustrating a fourth embodiment of the LED device.

Referring to FIG. 8, a fourth embodiment of the LED device is generally similar to the third embodiment, except that in the fourth embodiment, at least one of the first solder pad 901 and the second solder pad 902 further includes at least one bridging part 905 that is connected between two adjacent ones of the solder sub-pads 904. For example, each of the first solder pad 901 and the second solder pad 902 further includes a plurality of the bridging parts 905 each of which is connected between two adjacent ones of the solder sub-pads 904.

According to this disclosure, an LED packaging module (not shown) is also provided. The LED packaging module includes the LED device according to any one of the first to fourth embodiments, and a circuit board on which the LED device is mounted. The present disclosure also provides a display device (not shown) which includes the aforesaid LED packaging module.

Referring to FIGS. 9 to 13, a fifth embodiment of the LED device and variations thereof are illustrated. The LED device includes a substrate 10 and an epitaxial structure 210 formed on the substrate 10. The epitaxial structure 210 includes a first semiconductor layer 211, an active layer 212 and a second semiconductor layer 213 sequentially formed on the substrate 10 in a direction away from the substrate 10. In some embodiments, the epitaxial structure 210 may be similar to the epitaxial structure 20 of the first embodiment and includes three light emitting units (not shown).

The LED device further includes a first metal solder pad 50 electrically connected to the first semiconductor layer 211 and a second metal solder pad 51 electrically connected to the second semiconductor layer 213. The first metal solder pad 50 and the second metal solder pad 51 are disposed on the same side of the LED device. In the following manufacturing procedures, the LED device having the first metal solder pad 50 and the second metal solder pad 51 may be flipped over and mounted on a carrier substrate or a packaging substrate through, e.g., reflow soldering process or formation of a eutectic system by heating.

Figure 9:
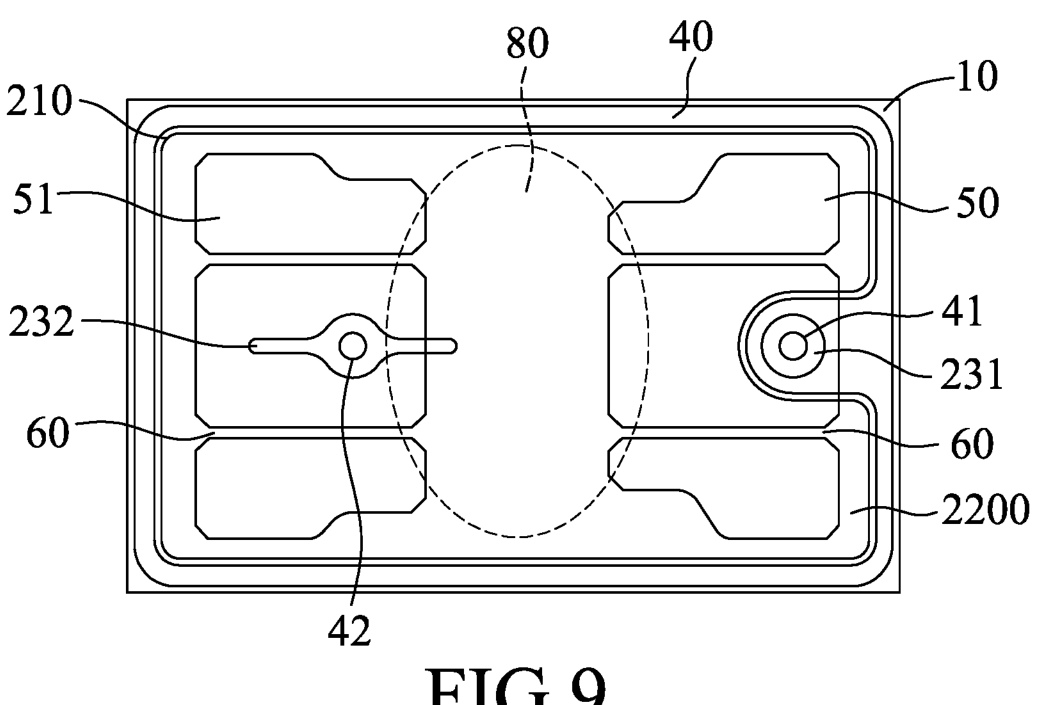
FIG. 9 is a schematic top view illustrating a fifth embodiment of the LED device.
Figure 10:
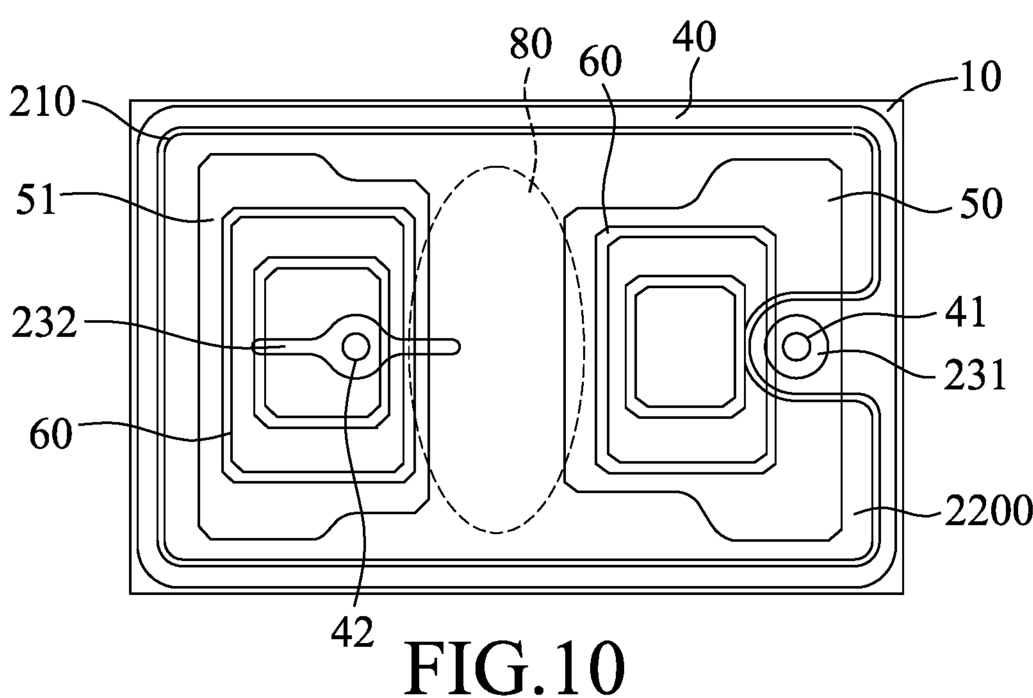
FIGS. 10 to 12 are schematic top views respectively illustrating different variations of the fifth embodiment of the LED device.

At least one of the first metal solder pad 50 and the second metal solder pad 51 includes a plurality of solder sub-pads that are spaced apart from each other by at least one trench 60. In certain embodiments, each of the first metal solder pad 50 and the second metal solder pad 51 includes the solder sub-pads that are spaced apart from each other by a plurality of the trenches 60. For example, the first metal solder pad 50 may have an odd number or an even number of the solder sub-pads (respectively separated by an even number or an odd number of the trenches 60), and the second metal solder pad 51 may have an even number of the solder sub-pads (separated by an odd number of the trenches 60). Each of the trenches 60 of the first metal solder pad 50 and the second metal solder pad 51 may independently have the same shape or a different shape. For example, the trenches 60 may be in the shape of a thin strip or the trenches 60 may have a ring shape. However, this is not a limitation of the disclosure. For example, each of the trenches 60 of the first metal solder pad 50 and the second metal solder pad 51 may be in the shape of a thin strip. Alternatively, each of the trenches 60 of the first metal solder pad 50 may have a ring shape and each of the trenches 60 of the second metal solder pad 51 may be in the shape of a thin strip. As shown in FIG. 9, each of the trenches 60 is in the shape of a thin strip and may extend in the same extension direction (such as extending parallel to a side of the LED device), or the trenches 60 may alternatively extend in different extension directions, wherein a width of each trench 60 is equal to the distance between two adjacent ones of the solder sub-pads and a length thereof is a geometrical length in the extension direction (s). As shown in FIG. 10, each of the trenches 60 loop around to encircle a rectangular shape, where the width of the encircled rectangular shape is equal to the distance between two adjacent ones of the solder sub-pads and the trenches 60 form the geometrical perimeter of the rectangular shape.

Each of the trenches 60 penetrates the first metal solder pad 50 or the second metal solder pad 51, so as to divide the first metal solder pad 50 or the second metal solder pad 51 into a plurality of solder sub-pads that are completely separated from each other. Each of the solder sub-pads may have the same size or a different size (see FIG. 9).

Figure 11:
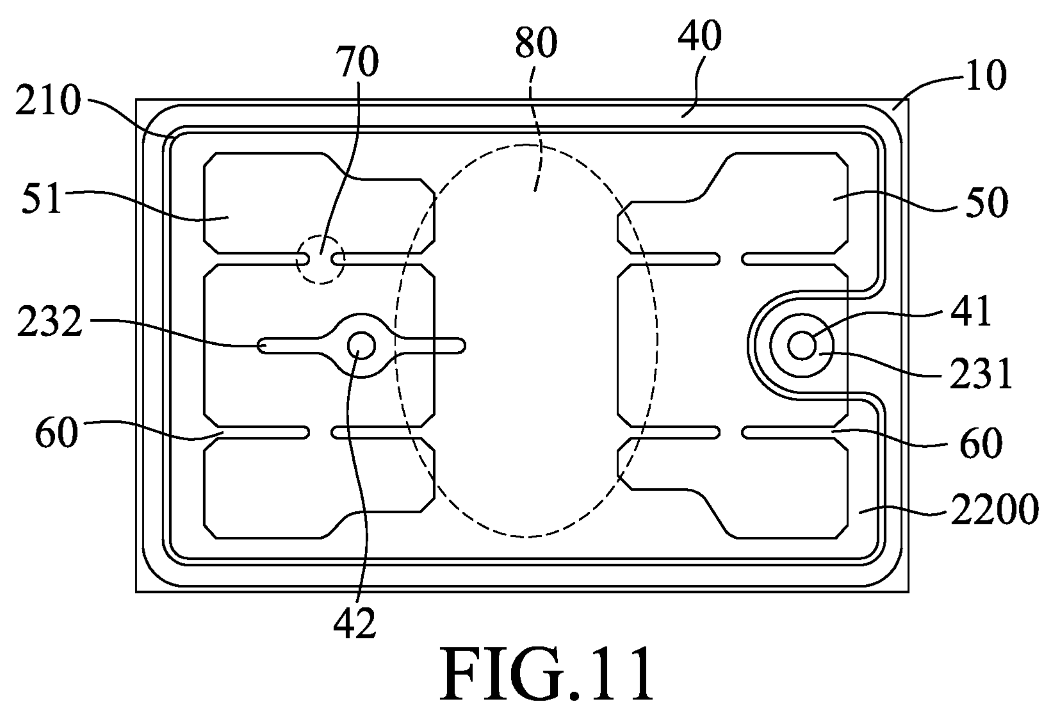
Figure 12:
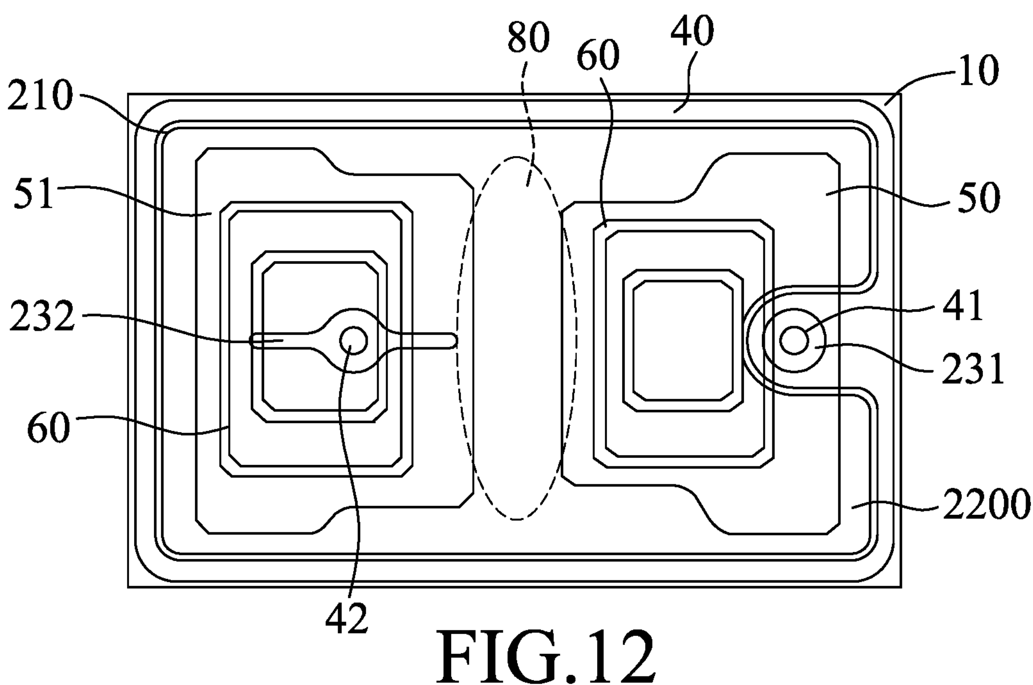

Referring to FIG. 11, in one variation of the fifth embodiment, at least one of the first metal solder pad 50 and the second metal solder pad 51 further includes at least one bridging part 70 that is connected between two adjacent ones of the solder sub-pads. That is, the solder sub-pads are not completely separated from each other. The trenches 60 may be located at one side or both sides of the bridging part 70. The bridging part has a width that is defined in a direction perpendicular to the width of the trench 60. In some embodiments, the width of the bridging part 70 is not greater than three times of the width of the trench 60.

The width of each of the trenches 60 ranges from 2 μm to 35 μm, such as ranging from 2 μm to 10 μm, ranging from 10 μm to 20 μm or ranging from 20 μm to 30 μm. If the width of each of the trenches 60 is smaller than 2 μm, the trenches 60 may not release enough strain, which may lead to the first metal solder pad 50 and the second metal solder pad 51 being dislocated from the epitaxial structure 210 over time.

The overall area of the projections of the trenches 60 of the first metal solder pad 50 on the substrate 10 and the overall area of the projection of the first metal solder pad 50 on the substrate 10 (which includes the overall area of the projections of the trenches 60 of the first metal solder pad 50) may have a ratio that is not greater than 1:4. The overall area of the projections of the trenches 60 of the second metal solder pad 51 and the overall area of the projection of the second metal solder pad 51 on the substrate 10 (which includes the overall area of the projections of the trenches 60 of the second metal solder pad 51) may have a ratio that is not greater than 1:4. In some embodiments, the aforesaid ratio may be 1:6 or 1:10, so as to achieve an excellent die bonding effect. If the ratio is greater than 1:4 (i.e., the solder sub-pads have relatively small size), die bonding performance may be reduced.

The first metal solder pad 50 and the second metal solder pad 51 are spaced apart from each other by a gap region 80 that is located at a center of one side of the LED device. The gap region 80 has a width that is greater than the width of the trenches 60 of the first metal solder pads 50 and/or the width of the trenches 60 of second metal solder pads 51. In some embodiments, the width of the gap region 80 ranges from 30 μm to 200 μm. The gap region 80 may be used to avoid a short circuit forming between the first and second metal solder pads 50 and 51 caused by heating when the LED device is mounted to the carrier substrate or the packaging substrate.

Figure 13:
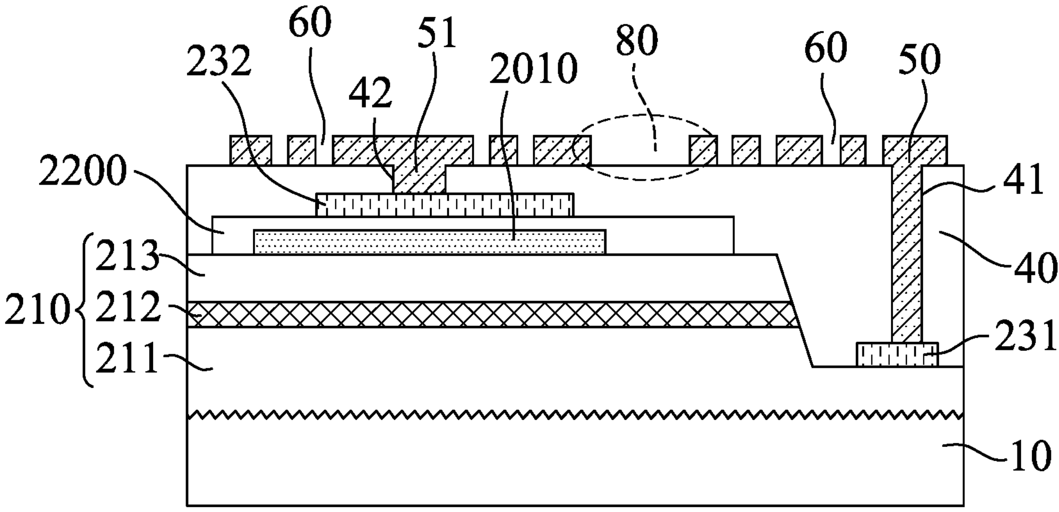
FIG. 13 is a cross-sectional schematic view illustrating the variation of the LED device of FIG. 12.

Further referring to FIG. 13, the LED device of the fifth embodiment and variations thereof may further includes an insulating layer 40 that covers the epitaxial structure 210 opposite to the substrate 10 and that is formed with through holes 41, 42 which respectively correspond in position to the first and second metal solder pads 50 and 51. The first and second metal solder pads 50, 51 are disposed on the insulating layer 40, and respectively fill the through holes 41, to be electrically connected to the second semiconductor layer 213 and the first semiconductor layer 211.

The trenches 60 of the first and second metal solder pads 50, 51 are formed on the insulating layer 40, and a projection of each of the trenches 60 on the substrate 10 does not overlap with a projection of each of the through holes 41, 42 on the substrate 10.

The number of the through holes 41 of the first metal solder pad 50 is equal to or smaller than the number of the solder sub-pads of the first metal solder pad 50. In other words, some or all of the solder sub-pads fills a corresponding one of the through holes 41 of the first metal solder pad 50. Similarly, the number of the through holes 42 of the second metal solder pad 51 is equal to or smaller than the number of the solder sub-pads of the second metal solder pad 51. In other words, some or all of the solder sub-pads fills a corresponding one of the through holes 42 of the second metal solder pad 51. For example, as shown in FIG. 13, only one of the solder sub-pads located at the center or periphery of the first metal solder pad 50 fills the through hole 41, and the remaining solder sub-pads are disposed on the insulating layer 40. In addition, only one of the solder sub-pads located at the center of the second metal solder pad 51 fills the through hole 42, and the remaining solder sub-pads are disposed on the insulating layer 40.

Each of the LED devices of the fifth embodiment and the variations thereof further includes a first electrode 231 and a second electrode 232. One of the first electrode 231 and the second electrode 232 may include a finger metal electrode that is disposed under the first metal solder pad 50 or the second metal solder pad 51. A projection of the finger metal electrode of the second electrode 232 on the substrate 10 is not greater than the projection of the second metal pad 51 on the substrate 10. In other words, the projection of the finger metal electrode of the second metal solder pad 51 on the substrate 10 falls within the projection of the second electrode 232 on the substrate 10.

Referring to FIG. 13, the LED device may further include a current blocking layer 2010 and a transparent and electrically conductive layer 2200 that are formed between the second semiconductor layer 213 and the second electrode 232. To be specific, the current blocking layer 2010 is formed on the second semiconductor layer 213 and the transparent and electrically conductive layer 2200 covers the current blocking layer 2010 and extends from the current blocking layer 2010 to contact the first semiconductor layer 2110. The first and second electrodes 231, 232 directly contact the first semiconductor layer 211 and the transparent and electrically conductive layer 2200, respectively.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode (LED) device, comprising:

a substrate which has a substrate surface including a first side and a second side that is connected with and perpendicular to said first side, said first side having a length equal to or greater than a length of said second side;

an epitaxial structure which includes a first light emitting unit, a second light emitting unit and a third light emitting unit that are spacedly and sequentially disposed on said substrate surface in such order along a direction away from said second side, said epitaxial structure having an epitaxial surface opposite to said substrate surface, each of said first light emitting unit, said second light emitting unit and said third light emitting unit including a first semiconductor layer, an active layer and a second semiconductor layer sequentially formed on said substrate surface in a direction away from said substrate surface; and a plurality of bridging electrodes, each of which is disposed on said epitaxial surface and electrically connected between two adjacent ones of said first light emitting unit, said second light emitting unit and said third light emitting unit, wherein a projection of each of said first light emitting unit, said second light emitting unit and said third light emitting unit on said substrate surface has a first edge and a second edge that is connected with and perpendicular to said first edge, said first edge being parallel to said second side and having a length equal to or greater than a length of said second edge, wherein said second light emitting unit further has a flat operating zone on said epitaxial surface that is adapted to be pushed by an ejector pin and that is in a circular form, the length of said second edge being equal to or greater than a diameter of said operating zone, the diameter of said operating zone being at least 60 μm, wherein each of said bridging electrodes includes a first bridging sub-electrode and a second bridging sub-electrode which are symmetrically arranged on opposite sides of a central axis extending along said first side and perpendicular to said first edge, each of said first bridging sub-electrode and said second bridging sub-electrode is electrically connected between said two adjacent ones of said first light emitting unit, said second light emitting unit and said third light emitting unit, wherein for each of said bridging electrodes, each of said first bridging sub-electrode and said second bridging sub-electrode comprises:

a first portion that is disposed on said second semiconductor layer of one of said two adjacent ones of said first light emitting unit, said second light emitting unit and said third light emitting unit, a second portion that is disposed on said first semiconductor layer of the other one of said two adjacent ones of said first light emitting unit, said second light emitting unit and said third light emitting unit; and a connecting portion that connects said first portion to said second portion, and that is disposed across said two adjacent ones of said first light emitting unit, said second light emitting unit and said third light emitting unit, and wherein for said bridging electrode that is connected between said first light emitting unit and said second light emitting unit, said first portion of said first bridging sub-electrode and said first portion of said second bridging sub-electrode are directly connected to each other, and said second portion of said first bridging sub-electrode and said second portion of said second bridging sub-electrode are indirectly connected to each other, and cooperatively form a gap therebetween.

2. The LED device of claim 1, wherein the diameter of said operating zone ranges from 60 μm to 80 μm, and the length of said second edge ranges from 60 μm to 150 μm.

3. The LED device of claim 1, wherein a ratio of the length of said first side to the length of said second side of said substrate is not greater than 3:1.

4. The LED device of claim 1, wherein for each of said first light emitting unit, said second light emitting unit and said third light emitting unit, a ratio of the length of said first edge to the length of said second edge is not greater than 3:1.

5. The LED device of claim 1, wherein each of said first, second and third light emitting units emits blue light.

6. The LED device of claim 1, wherein a projection of one of said bridging electrodes electrically connected between said first light emitting unit and said second light emitting unit on said substrate surface is spaced apart from a projection of another one of said bridging electrodes electrically connected between said second light emitting unit and said third light emitting unit by a distance along said second edge that ranges from 60 μm to 100 μm.

7. The LED device of claim 1, wherein said first portion and said second portion are disposed in parallel to said first edge and extending along said first edge.

8. The LED device of claim 1, wherein for each of said bridging electrodes, said first portions of said first bridging sub-electrode and said second bridging sub-electrode are connected to each other, said second portion is parallel to said first edge of each of said first light emitting unit, said second light emitting unit and said third light emitting unit, and said second portions are electrically connected to each other through said first portions and said connecting portions.

9. The LED device of claim 8, wherein said first bridging sub-electrode and said second bridging sub-electrode are connected in a U shape.

10. The LED device of claim 1, further comprising:

a first electrode which is disposed on and electrically connected to said first semiconductor layer of said first light emitting unit; and a second electrode which is disposed on and electrically connected to said second semiconductor layer of said third light emitting unit, wherein each of said first electrode and said second electrode includes an extension portion which extends along said first edge.

11. The LED device of claim 10, wherein for each of said first electrode and said second electrode, said extension portion is disposed in parallel to said first edge.

12. The LED device of claim 10, further comprising:

a first solder pad which is electrically connected to said first electrode; and a second solder pad which is electrically connected to said second electrode.

* * * * *